(12) United States Patent
Joo et al.

(10) Patent No.: US 9,007,850 B2
(45) Date of Patent: Apr. 14, 2015

(54) PAGE BUFFER, MEMORY DEVICE COMPRISING PAGE BUFFER, AND RELATED METHOD OF OPERATION

(71) Applicant: Samsung Electronics Co., Ltd., Suwon-si, Gyeonggi-do (KR)

(72) Inventors: Sang-Hyun Joo, Hwaseong-si (KR); Il-Han Park, Suwon-si (KR); Ki-Hwan Song, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 330 days.

(21) Appl. No.: 13/718,105

(22) Filed: Dec. 18, 2012

(65) Prior Publication Data

US 2013/0250678 A1 Sep. 26, 2013

(30) Foreign Application Priority Data

Mar. 26, 2012 (KR) .................. 10-2012-0030744

(51) Int. Cl.
*G11C 7/10* (2006.01)
*G11C 11/24* (2006.01)
*G11C 16/02* (2006.01)
*G11C 16/10* (2006.01)

(52) U.S. Cl.
CPC .............. *G11C 11/24* (2013.01); *G11C 16/02* (2013.01); *G11C 2216/14* (2013.01); *G11C 16/10* (2013.01)

(58) Field of Classification Search
CPC ........ G11C 11/24; G11C 16/02; G11C 16/10; G11C 2216/14; G11C 23/00
USPC .......................... 365/189.05, 189.08, 189.03
See application file for complete search history.

(56) References Cited

U.S. PATENT DOCUMENTS

| | | | |
|---|---|---|---|
| 4,802,135 A * | 1/1989 | Shinoda et al. ............ 365/233.1 |
| 7,729,177 B2 | 6/2010 | Song et al. |
| 7,796,431 B2 | 9/2010 | Chen |
| 2004/0052124 A1 | 3/2004 | Sudo et al. |
| 2006/0221695 A1 | 10/2006 | Kim |
| 2006/0274588 A1 | 12/2006 | Kang et al. |
| 2009/0185419 A1 | 7/2009 | Seong et al. |
| 2009/0303801 A1 * | 12/2009 | Kim ........................ 365/189.05 |
| 2010/0091582 A1 | 4/2010 | Vali et al. |
| 2012/0099386 A1 * | 4/2012 | Yoo et al. ................. 365/189.05 |

* cited by examiner

*Primary Examiner* — Tuan T Nguyen
(74) *Attorney, Agent, or Firm* — Volentine & Whitt, PLLC

(57) ABSTRACT

A page buffer comprises a static latch configured to store data received from an external device, and a dynamic latch configured to receive the data stored in the static latch through a floating node, the dynamic latch comprising a storage capacitor, a write transistor configured to write the data of the floating node to the storage capacitor, and a read transistor configured to read the data of the storage capacitor, and the write transistor and the read transistor sharing the floating node.

20 Claims, 13 Drawing Sheets

PAGE BUFFER, MEMORY DEVICE COMPRISING PAGE BUFFER, AND RELATED METHOD OF OPERATION

CROSS-REFERENCE TO RELATED APPLICATION

This application claims priority under 35 U.S.C. §119 to Korean Patent Application No. 10-2012-0030744 filed on Mar. 26, 2012, the subject matter of which is hereby incorporated by reference.

BACKGROUND OF THE INVENTION

The inventive concept relates generally to electronic circuit technologies. More particularly, certain embodiments of the inventive concept relate to a page buffer, a memory device comprising the page buffer, and related methods of operation.

A latch is a digital circuit that can store one or more bits of data. A latch can be classified generally as a static latch or a dynamic latch. A static latch is capable of retaining stored data for an extended period of time without a refresh operation. A dynamic latch, on the other hand, will lose stored data after a period of time if no refresh operation is performed.

A page buffer of a memory device can be implemented by one or more static and/or dynamic latches. Such a page buffer can be used, for instance, to store data to be written in one or more memory cells of the memory device or data read from one or more memory cells of the memory device.

As the feature size of electronic devices continues to get smaller and smaller, there is a continuing demand for a smaller page buffer circuitry. Accordingly, to address this demand researchers are engaged in ongoing efforts to design latch circuits with smaller size.

SUMMARY OF THE INVENTION

In one embodiment of the inventive concept, a page buffer comprises a static latch configured to store data received from an external device, and a dynamic latch configured to receive the data stored in the static latch through a floating node, the dynamic latch comprising a storage capacitor, a write transistor configured to write the data of the floating node to the storage capacitor, and a read transistor configured to read the data of the storage capacitor, and the write transistor and the read transistor sharing the floating node.

In another embodiment of the inventive concept, a method of operating a memory device comprises storing data from a memory cell to a static latch, and storing data from the static latch to a storage capacitor of a dynamic latch through a floating node, wherein the data from the static latch is stored in the storage capacitor by charge sharing based on a ratio of capacitance of the floating node to capacitance of the storage capacitor.

In still another embodiment of the inventive concept, a memory device comprises a memory cell array comprising a plurality of memory cells, and a page buffer configured to store data to be written in a selected memory cell among the plurality of memory cells and to store data read from the selected memory cell. The page buffer comprises a static latch configured to store data received from an external device, and a dynamic latch configured to receive the data stored in the static latch through a floating node, the dynamic latch comprising a storage capacitor, a write transistor configured to write the data of the floating node to the storage capacitor, and a read transistor configured to read the data of the storage capacitor, and the write transistor and the read transistor sharing the floating node.

These and other embodiments of the inventive concept may potentially allow a page buffer to be formed with reduced size and improved performance, which in turn can reduce the size of a memory device incorporating the page buffer.

BRIEF DESCRIPTION OF THE DRAWINGS

The drawings illustrate selected embodiments of the inventive concept. In the drawings, like reference numbers indicate like features, and the relative dimensions of certain features may be exaggerated for clarity of illustration.

DETAILED DESCRIPTION

Embodiments of the inventive concept are described below with reference to the accompanying drawings. These embodiments are presented as teaching examples and should not be construed to limit the scope of the inventive concept.

In the description that follows, where a feature is referred to as being "on" or "connected to" another feature, it can be directly on or connected to the other feature or intervening features may be present. In contrast, where a feature is referred to as being "directly on" or "directly connected to" another feature, there are no intervening features present. As used herein, the term "and/or" indicates any and all combinations of one or more of the associated listed items.

The use of the terms "a" and "an" and "the" and similar referents are to be construed to cover both the singular and the plural, unless otherwise indicated by context. Terms such as "comprising," "having," "including," "containing," etc., are to be construed as open-ended terms unless otherwise noted.

Although the terms first, second, etc. may be used to describe various features, the described features are not to be limited by these terms. Rather, these terms are used merely to distinguish between different features. Thus, for example, a first feature could be termed a second feature, and vice versa, without materially changing the meaning of the description.

Unless defined otherwise, all technical and scientific terms used herein have the same meaning as commonly understood by one of ordinary skill in the art. The use of any and all examples or example terms is intended merely to better illuminate the inventive concept and is not a limitation on the scope of the inventive concept unless otherwise specified. Further, unless defined otherwise, terms such as those defined in common dictionaries should not be interpreted in an overly formal manner.

Figure 1:
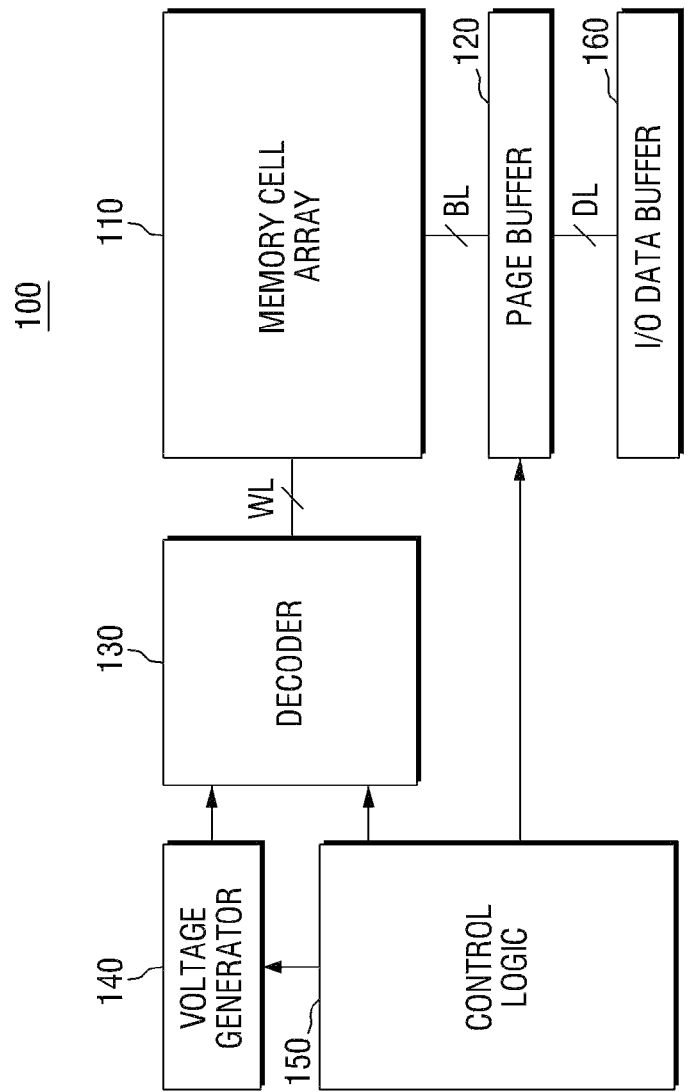
FIG. 1 is a diagram of a memory device according to an embodiment of the inventive concept.

FIG. 1 is a diagram of a memory device 100 according to an embodiment of the inventive concept. Memory device 100 may be, for example, a nonvolatile memory device such as a NAND flash or NOR flash device. Alternatively, memory device 100 could take other forms, such as a phase-change random-access memory (PRAM), a magneto-resistive random-access memory (MRAM), or a resistive random-access memory (RRAM).

Referring again to FIG. 1, memory device 100 comprises a memory cell array 110, a page buffer 120, a decoder 130, a voltage generator 140, a controller 150, and an input/output data buffer 160.

Memory cell array 110 comprises a plurality of memory cells. Each memory cell stores n-bit data, where n is an integer greater than or equal to 1. Memory cell array 110 is divided into a plurality of regions. In particular, memory cell array 110 comprises a data region in which ordinary data is stored, and a spare region. Each region of memory cell array 110 comprises a plurality of memory blocks.

Page buffer 120 is configured to write data in a selected memory cell of memory cell array 110 under control of controller 150 or to read data from the selected memory cell. Decoder 130 is controlled by controller 150 and is configured to select a memory block of memory cell array 110 and to select a word line WL of the selected memory block. Word line WL selected by decoder 130 is driven by a word line voltage generated from voltage generator 140. Voltage generator 140 is controlled by controller 150 and is configured to generate a word line voltage to be supplied to memory cell array 110. The word line voltage can be, for instance, a read voltage, a write voltage, a path voltage, a local voltage, or a verify voltage. Input/output data buffer 160 receives a read result of page buffer 120 and transmits the same to an external device. It also transfers data received from the external device to page buffer 120. Controller 150 is configured to control overall operations of memory device 100.

Figure 2:
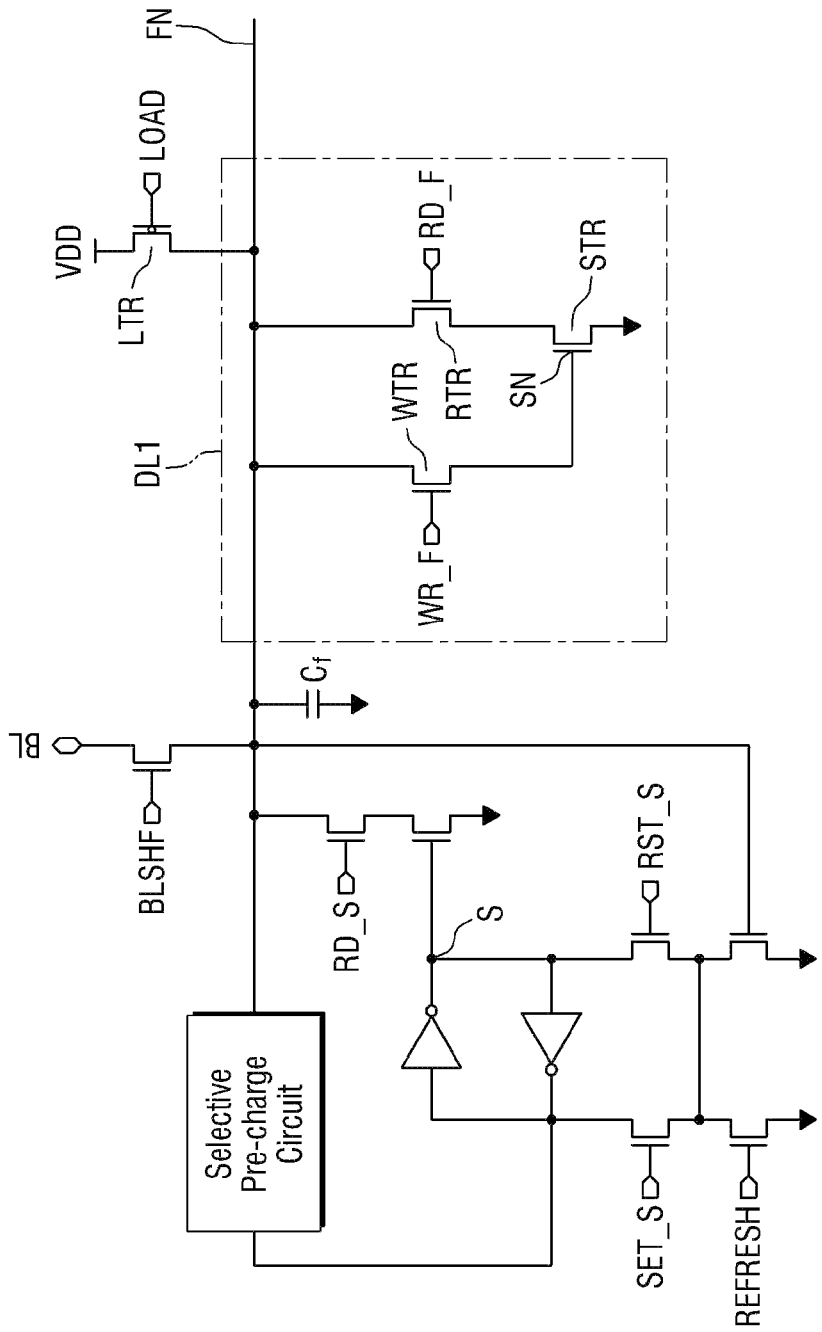
FIG. 2 is a circuit diagram of a page buffer according to an embodiment of the inventive concept.
Figure 3:
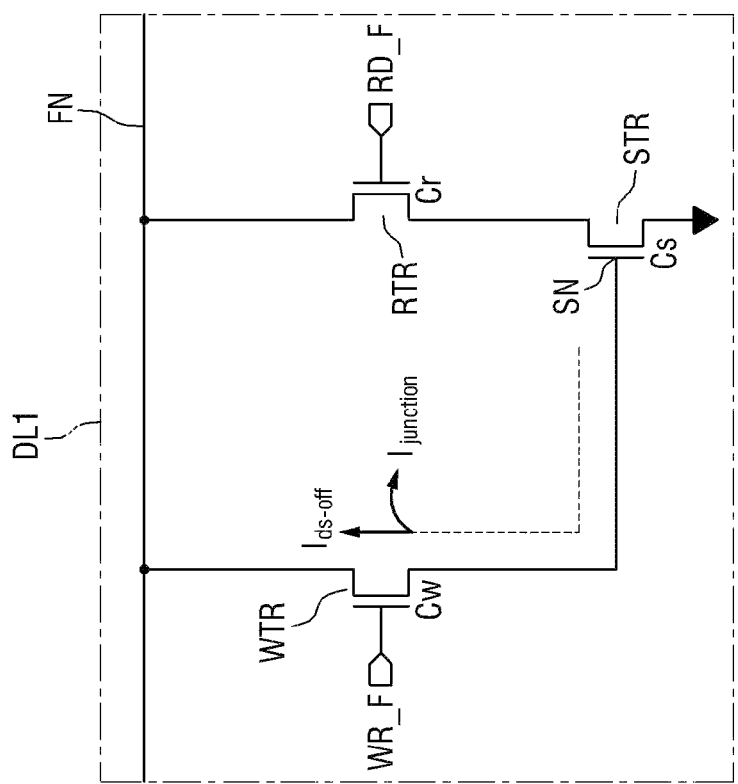
FIG. 3 is a circuit diagram of a dynamic latch according to an embodiment of the inventive concept.
Figure 4:
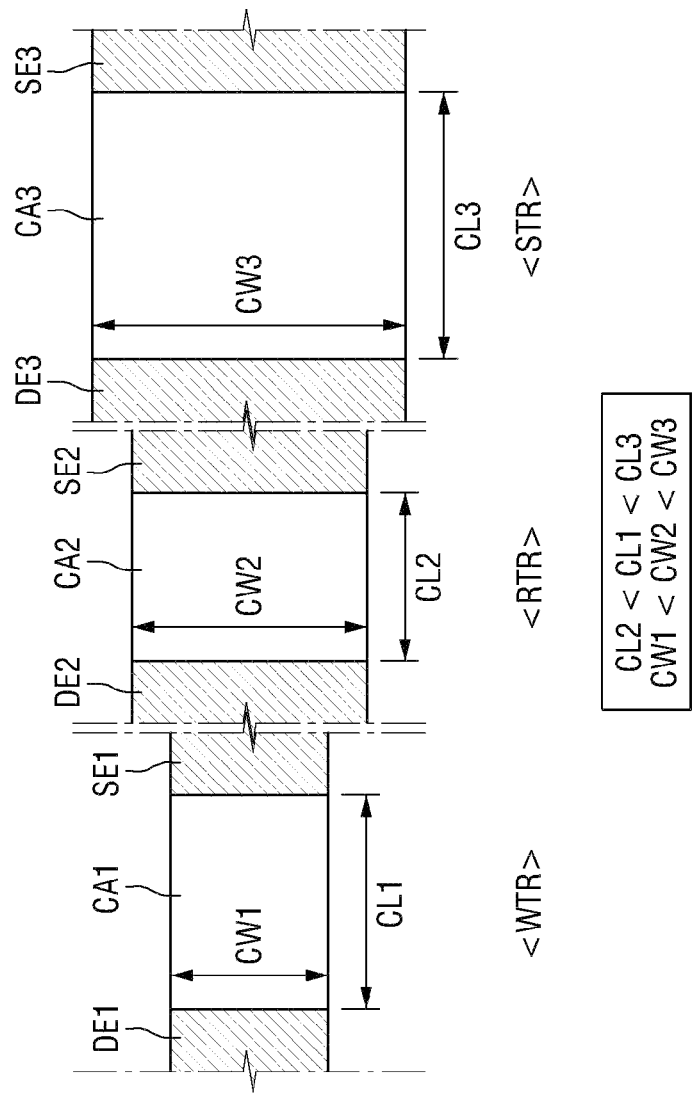
FIG. 4 is a diagram illustrating respective sizes of a write transistor, a read transistor, and a storage transistor in a dynamic latch.

FIG. 2 is a circuit diagram of a page buffer according to an embodiment of the inventive concept, FIG. 3 is a circuit diagram of a dynamic latch according to an embodiment of the inventive concept, and FIG. 4 is a diagram illustrating respective sizes of a write transistor, a read transistor, and a storage transistor in the page buffer of FIG. 2. For explanation purposes, the page buffer of FIG. 2 will be described as an example of page buffer 120 illustrated in FIG. 1. In other words, it will be described in the context of other features in FIG. 1, although it is not necessarily restricted to this context.

Referring to FIGS. 2 and 3, the page buffer comprises a static latch S that stores data received from an external device, such as a memory cell of memory cell array 110, and a dynamic latch DL1 that receives the data stored in static latch S through a floating node FN.

Static latch S and dynamic latch DL1 may be used to transmit the data stored in the memory cell in memory cell array 110 to input/output data buffer 180 or to program the data received from input/output data buffer 180 in the memory cell in the memory cell array 110.

Although FIG. 2 illustrates a circuit diagram of a page buffer comprising an inverter, a plurality of control transistors, a static latch S, and a dynamic latch DL1, the inventive concept is not limited to these features. For example, a connection method of static latch S and dynamic latch DL1 may vary according to the necessity.

Dynamic latch DL1 comprises a floating node FN, a storage node SN, a write transistor WTR and a read transistor RTR. Write transistor WTR and read transistor RTR share a floating node FN, as shown in FIG. 2. Write transistor WTR is directly connected to floating node FN, and read transistor RTR is also directly connected to the floating node. In particular, a first electrode (e.g., a drain electrode) of write transistor WTR is directly connected to floating node FN, and a first electrode (e.g., a drain electrode) of read transistor RTR is directly connected to floating node FN.

A second electrode (e.g., a source electrode) of write transistor WTR is connected to a storage node SN. Here, write transistor WTR writes the data of floating node FN to storage node SN according to a write signal WR_F of the gate electrode of write transistor WTR. Write transistor WTR transfers some of the charges charged to floating node F to storage node SN in response to write signal WR_F at the gate electrode of write transistor WTR.

Storage node SN is typically implemented using a gate capacitor of a transistor. For example, storage node SN may be implemented using a gate capacitor of a storage transistor STR having a gate electrode connected to write transistor WTR and a first electrode (e.g., a drain electrode) connected to read transistor RTR. In other words, storage node SN is a storage capacitor comprising a gate electrode, a gate insulation film, and source and drain electrodes of a storage transistor STR having predetermined capacitance Cs. Meanwhile, a second electrode (e.g., a source electrode) of storage transistor STR is connected to a ground terminal, as shown in the drawing.

A second electrode (e.g., a source electrode) of read transistor RTR is connected to the first electrode (e.g., drain electrode) of storage transistor STR. Here, read transistor RTR reads data of storage node SN. Where a read signal RD_F is applied to the gate electrode of read transistor RTR, read transistor RTR changes a level of the charge of floating node FN according to the level of the charge of storage node SN, thereby reading the data of storage node SN. Consequently, the data of floating node FN is written to storage node SN through write transistor WTR, or floating node FN may remain at a floating state while the data of storage node SN is read.

A charge source that supplies charges to floating node FN may be further connected to floating node FN. For instance, in FIG. 2, the charge source comprises a load transistor LTR. Load transistor LTR has a first electrode (e.g., source electrode) connected to a power source terminal VDD and a second electrode (e.g., drain electrode) connected to floating node FN. Load transistor LTR supplies charges received from the power source terminal VDD to floating node FN according to a load signal LOAD applied to the gate electrode.

In the embodiment of FIG. 2, write transistor WTR, read transistor RTR, and storage transistor STR are implemented by NMOS transistors and load transistor LTR is implemented by a PMOS transistor. Alternatively, write transistor WTR, read transistor RTR, and storage transistor STR could be implemented by PMOS transistors and load transistor LTR could be implemented by an NMOS transistor. In this alternative, the first electrode of storage transistor STR can be connected to the power supply terminal VDD and the first electrode of load transistor LTR can be connected to ground.

Referring to FIG. 4, there is shown a source electrode SE3 and a drain electrode DE3 of a storage transistor STR, source electrodes SE1 and SE2 and drain electrodes DE1 and DE2 of a write transistor WTR and a read transistor RTR. Here, while gate electrodes of respective transistor STR, WTR and RTR are formed to overlap source electrodes SE1 to SE3 and drain electrodes DE1 to DE3 over source electrodes SE1 to SE3 and drain electrodes DE1 to DE3, they are not illustrated for the sake of simplicity.

As illustrated in FIG. 4, storage transistor STR has a size greater than that of write transistor WTR or read transistor RTR. Source electrode SE3 of storage transistor STR is larger than source electrode SE1 or SE2 of write transistor WTR or read transistor RTR, and drain electrode DE3 of storage transistor STR may be larger than drain electrode DE1 or DE2 of write transistor WTR or read transistor RTR.

Further, a channel section area CA3 surrounded by source electrode SE3 and drain electrode DE3 of storage transistor STR is also greater than a channel section area CA1 or CA2 of write transistor WTR or read transistor RTR.

Channel section area CA3 of storage transistor STR is greater than that of channel section area CA1 or CA2 of write transistor WTR or read transistor RTR because a channel length CL3 of storage transistor STR is greater than a channel length CL1 or CL2 of write transistor WTR or read transistor RTR, or a channel width CW3 of storage transistor STR is greater than a channel width CW1 or CW2 of write transistor WTR or read transistor RTR. In particular, in some embodiments of the inventive concept, both of channel length CL3 and channel width CW3 of storage transistor STR may be greater than channel length CL1 or CL2 and channel width CW1 or CW2 of write transistor WTR or read transistor RTR.

Storage transistor STR can be formed to be larger than write transistor WTR or read transistor RTR for the purpose of forming a large-sized storage capacitor used as a storage node SN. In other words, a capability of storing data (e.g., charge) of storage node SN can be increased by making the storage capacitor large.

In some embodiments, channel length CL1 of write transistor RTR is greater than channel length CL2 of read transistor RTR. In addition, in some other embodiments, channel width CW1 of write transistor RTR is smaller than channel width CW2 of read transistor RTR. As described above, channel length CL1 of write transistor RTR is greater than channel length CL2 of read transistor RTR and channel width CW1 of write transistor RTR is smaller than channel width CW2 of read transistor RTR for the purpose of minimizing disturbance of the storage capacitor used as storage node SN.

Referring again to FIG. 3, the data (e.g., charge) stored in storage node SN may leak in a direction in which it passes through write transistor WTR (i.e., in a direction indicated by a dotted line shown in FIG. 3) according to the passage of time, thereby generating a leakage current. The leakage current passing through write transistor WTR comprises a source-drain leakage current $I_{ds\text{-}off}$ flowing via the source and drain of write transistor WTR, and a junction leakage current $I_{junction}$ flowing from a junction of the source and channel region of write transistor WTR to a body of write transistor WTR.

Channel length CL1 of write transistor WTR is made to be large, thereby reducing the source-drain leakage current $I_{ds\text{-}off}$, while channel width CW1 of write transistor WTR is made to be small, thereby reducing the junction leakage current $I_{junction}$. Therefore, with the configuration described above, the disturbance of the storage capacitor used as storage node SN can be reduced, thereby improving the data (e.g., charge) storage capability of storage node SN.

Figure 5:
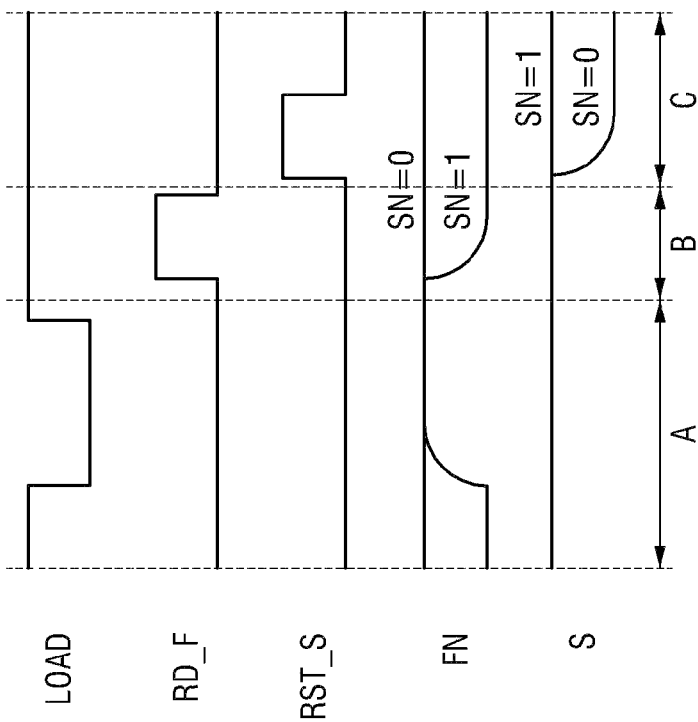
FIGS. 5 and 6 illustrate a write operation of the page buffer of FIG. 2.
Figure 6:
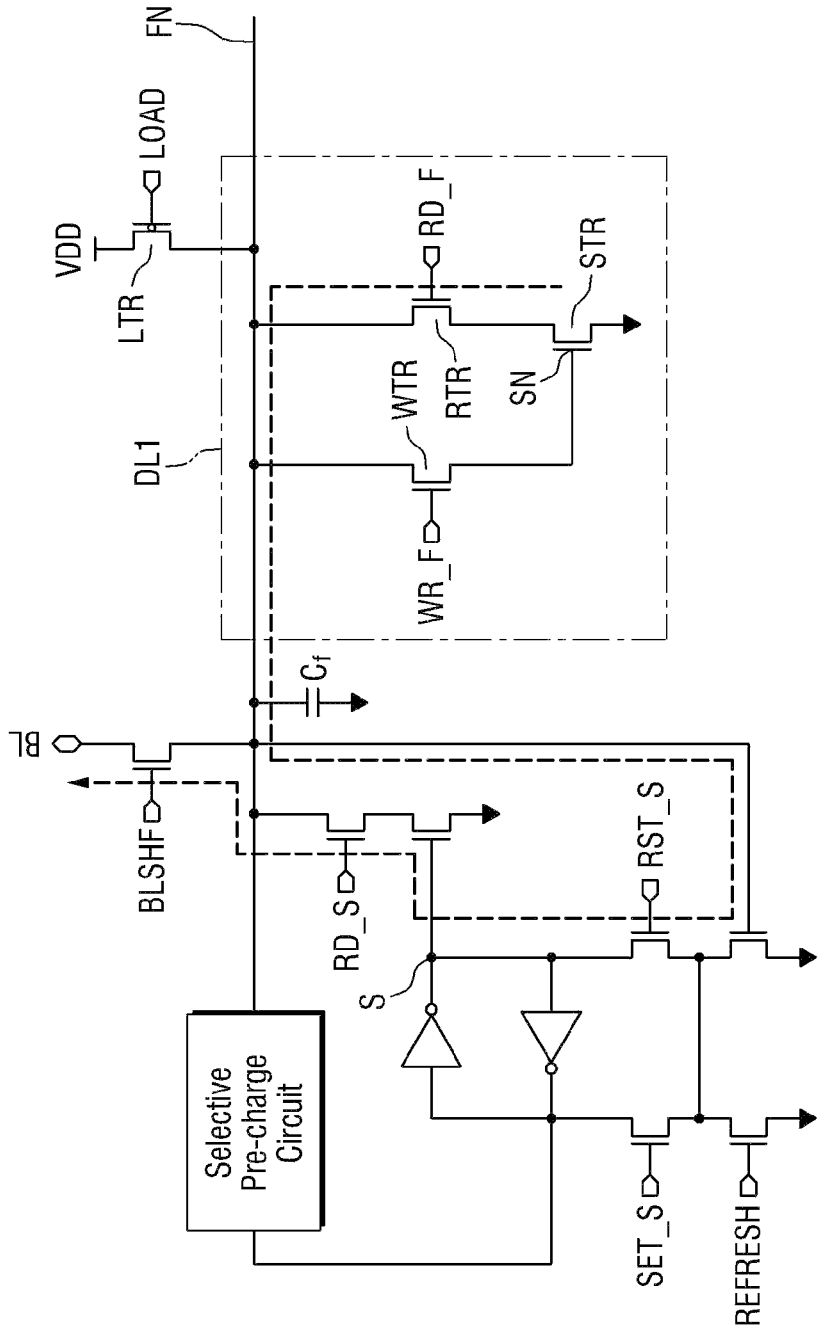

FIGS. 5 and 6 illustrate a write operation of the page buffer shown in FIG. 2.

Referring to FIGS. 5 and 6, data to be stored in storage node SN is provided from an external device, such as input/output data buffer 160. Write transistor WTR may be used to store the data in storage node SN.

In response to load signal LOAD, load transistor LTR is turned on. Once load transistor LTR is turned on, charges are supplied from a power source terminal VDD to a floating node FN, so that high level data (e.g., 1) is stored in floating node FN (i.e., in an A section). Next, where a read signal RD_F is applied to read transistor RTR, read transistor RTR is turned on. Here, floating node FN is developed according to the data stored in storage node SN, so that different levels of data are stored in floating node FN (i.e., in a B section).

Assuming that high level data (e.g., 1) is stored in storage node SN, storage transistor STR is turned on. Here, if read transistor RTR is turned on by read signal RD_F, floating node FN is connected to a ground terminal. Because the charges of floating node FN are all discharged to the ground terminal, no charge remains in floating node FN. Accordingly, low level data (e.g., 0) is stored in floating node FN.

Assuming that low level data (e.g., 0) is stored in storage node SN, storage transistor STR is turned off. Here, where read transistor RTR is turned on by read signal RD_F, floating node FN is not connected to the ground terminal and still remains at a floating state. Accordingly, high level data (e.g., 1) is stored in floating node FN.

The high level data (e.g., 1) stored in storage node SN is changed in its data level to then be stored in floating node FN as low level data (e.g., 0), while the low level data (e.g., 0) stored in storage node SN is changed in its data level to then be stored in floating node FN as high level data (e.g., 1).

Where reset signal RST_S is applied to static latch S, static latch S is developed according to the data stored in floating node FN, so that different levels of data are stored in floating node FN (i.e., in a C section).

Assuming that high level data (e.g., 1) is stored in floating node FN, a transistor serially connected to a transistor to which reset signal RST_S is applied is turned on. Therefore, the charges of floating node FN are all discharged to the ground terminal, and low level data (e.g., 0) is stored in static latch S when reset signal RST_S is applied thereto.

Conversely, assuming that low level data (e.g., 0) is stored in floating node FN, a transistor serially connected to a transistor to which reset signal RST_S is applied is turned off. Therefore, the charges of floating node FN are transmitted to static latch S when reset signal RST_S is applied thereto, and the high level data (e.g., 0) is stored in static latch S.

In other words, the high level data (e.g., 1) stored in floating node FN is changed in its data level to then be stored in static latch S as low level data (e.g., 0), while the low level data (e.g., 0) stored in floating node FN is changed in its data level to then be stored in static latch S as high level data (e.g., 1).

In the embodiment of FIGS. 5 an 6, the data stored in storage node SN may be changed in its data level to then be stored in floating node FN, while the data stored in floating node FN may be changed in its data level to then be stored in static latch S.

Figure 7:
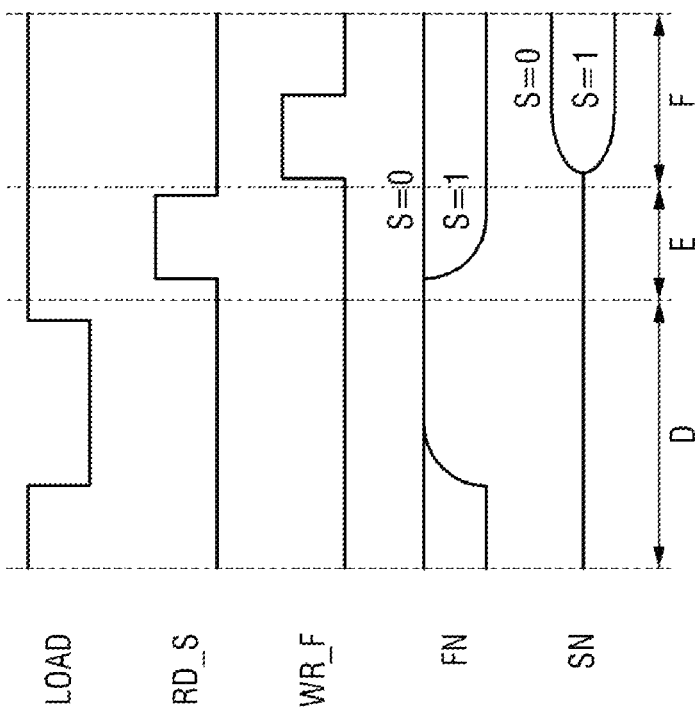
FIGS. 7 and 8 illustrate a read operation of the page buffer of FIG. 2.
Figure 8:
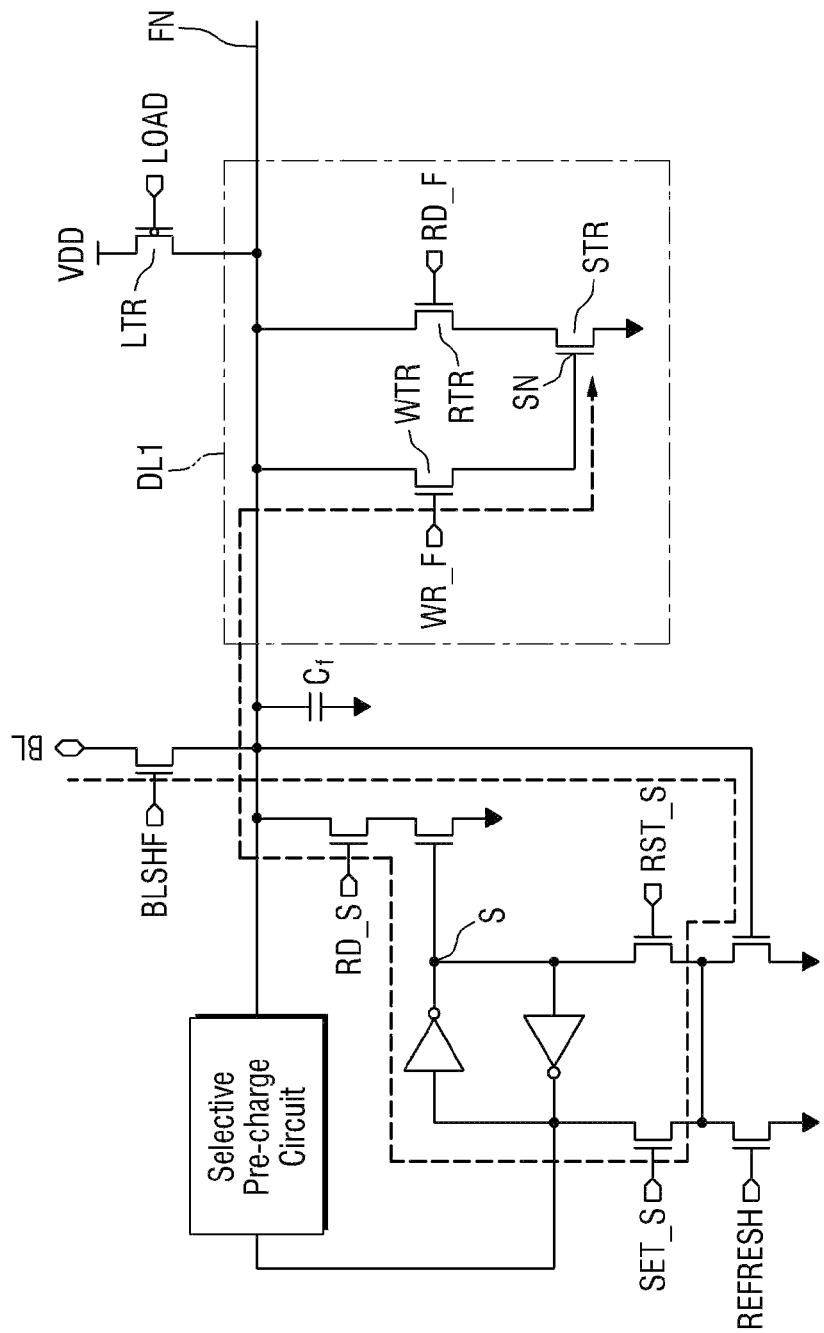

FIGS. 7 and 8 illustrate a read operation of the page buffer shown in FIG. 2.

Referring to FIGS. 7 and 8, data stored in a memory cell in memory cell array 110 is first stored in a static latch S through a bit line BL. While the example of FIG. 8 stores the data of the memory cell in static latch S through a bit line BL, this is merely one example configuration.

As shown in FIGS. 7 and 8, where a load signal LOAD is applied to a load transistor LTR, a load transistor LTR is turned on. Once load transistor LTR is turned on, charges are supplied from a power source terminal VDD to a floating node FN, so that high level data (e.g., 1) is stored in floating node FN (i.e., in a D section).

Next, as shown in FIGS. 7 and 8, where a read signal RD_S is applied to a static latch, floating node FN is developed according to the data stored in static latch S, so that different levels of data are stored in floating node FN (i.e., in an E section).

Assuming that high level data (e.g., 1) is stored in static latch S, as read signal RD_S is applied to static latch S, floating node FN is connected to a ground terminal. In this case, because the charges of floating node FN are all discharged to the ground terminal, no charge remains in floating node FN. Therefore, low level data (e.g., 0) is stored in floating node FN.

Conversely, assuming that low level data (e.g., 0) is stored in static latch S, even if read signal RD_S is applied to static latch S, floating node FN is not connected to the ground terminal and still remains at a floating state. Accordingly, the high level data (e.g., 0) is stored in floating node FN.

The high level data (e.g., 1) stored in static latch S is changed in its data level to then be stored in floating node FN as low level data (e.g., 0), while the low level data (e.g., 0) stored in static latch S is changed in its data level to then be stored in floating node FN as high level data (e.g., 1).

Where a write signal WR_F is applied to a write transistor WTR, write transistor WTR is turned on, and storage node SN is developed according to the data stored in floating node FN, so that different levels of data are stored in floating node FN (i.e., in an F section).

Assuming that high level data (e.g., 1) is stored in floating node FN, write transistor WTR is turned on. Therefore, the charges of floating node FN are shared according to the ratio of capacitance Cf of floating node FN to capacitance Cs of storage capacitor S, so that high level data (e.g., 1) is stored in storage node SN. In this example, capacitance Cf of floating node FN is greater than capacitance Cs of storage capacitor S.

Conversely, assuming that low level data (e.g., 0) is stored in floating node FN, write transistor WTR is turned on and floating node FN is connected to storage node SN and the low level data (e.g., 1) is stored in storage node SN.

The high level data (e.g., 1) stored in floating node FN is not changed in its data level to then be stored in storage node SN as still high level data (e.g., 1), while the low level data (e.g., 0) stored in floating node FN is not changed in its data level to then be stored in storage node SN as still low level data (e.g., 0).

In other words, according to some embodiments, the data stored in static latch S is changed in its data level to then be stored in floating node FN, while the data stored in floating node FN is not changed in its data level to then be stored in storage node SN. Therefore, the data stored in static latch S is changed in its data level to then be stored in storage node SN.

In the embodiment of FIGS. 7 and 8, the page buffer exchanges data through charge sharing while static latch S and dynamic latch DL1 share floating node FN. Therefore, a separate component (e.g., another latch) is not additionally required to transfer data, thereby achieving compactness of the page buffer.

Figure 9:
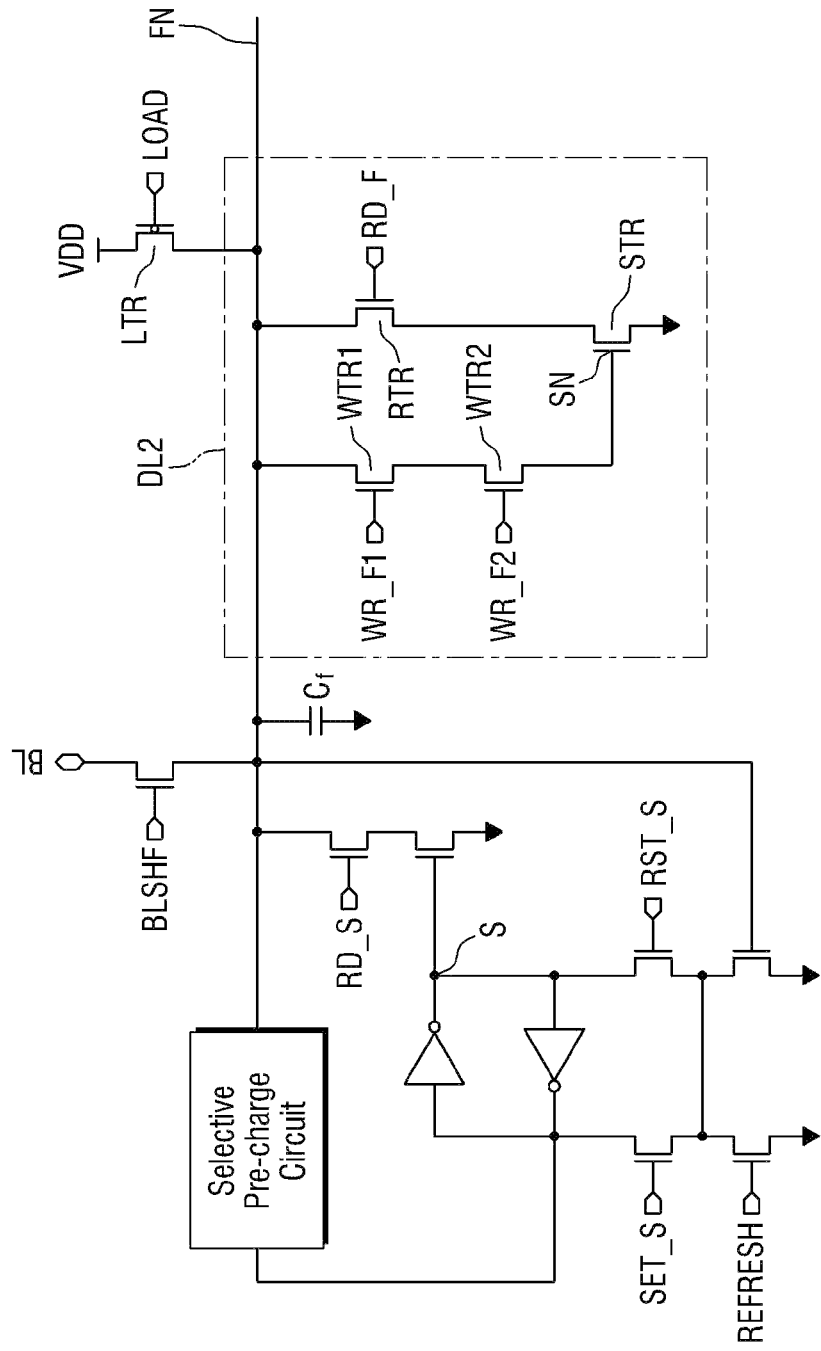
FIG. 9 is a circuit diagram of a page buffer according to another embodiment of the inventive concept.

FIG. 9 is a circuit diagram of a page buffer according to another embodiment of the inventive concept. This embodiment has certain features in common with other embodiments, and a repeated description of those features may be omitted in order to avoid redundancy.

Referring to FIG. 9, the page buffer comprises a dynamic latch DL2. Dynamic latch DL2 comprises two or more write transistors WTR1 and WTR2. FIG. 9 illustrates only two write transistors WTR1 and WTR2, but this is only one example, and the number of write transistors WTR1 and WTR2 may be changed in other examples.

The two or more write transistors WTR1 and WTR2 are connected in series to each other. A first electrode (e.g., a drain electrode) of a first write transistor WTR1 is connected to a floating node FN and a second electrode (e.g., a source electrode) of first write transistor WTR1 is connected to a first electrode (e.g., a drain electrode) of a second write transistor WTR2. A second electrode (e.g., a source electrode) of second write transistor WTR2 is connected to a gate electrode of a storage transistor STR. Respective write transistors WTR1 and WTR2 are turned on or off according to first and second write signals WR_F1 and WR_F2.

As indicated by the foregoing, where two or more write transistors WTR1 and WTR2 are connected in series to each other, channel lengths of write transistors WTR1 and WTR2 may be increased, thereby reducing the source-drain leakage current ($I_{ds\text{-}off}$ of FIG. 3).

Figure 10:
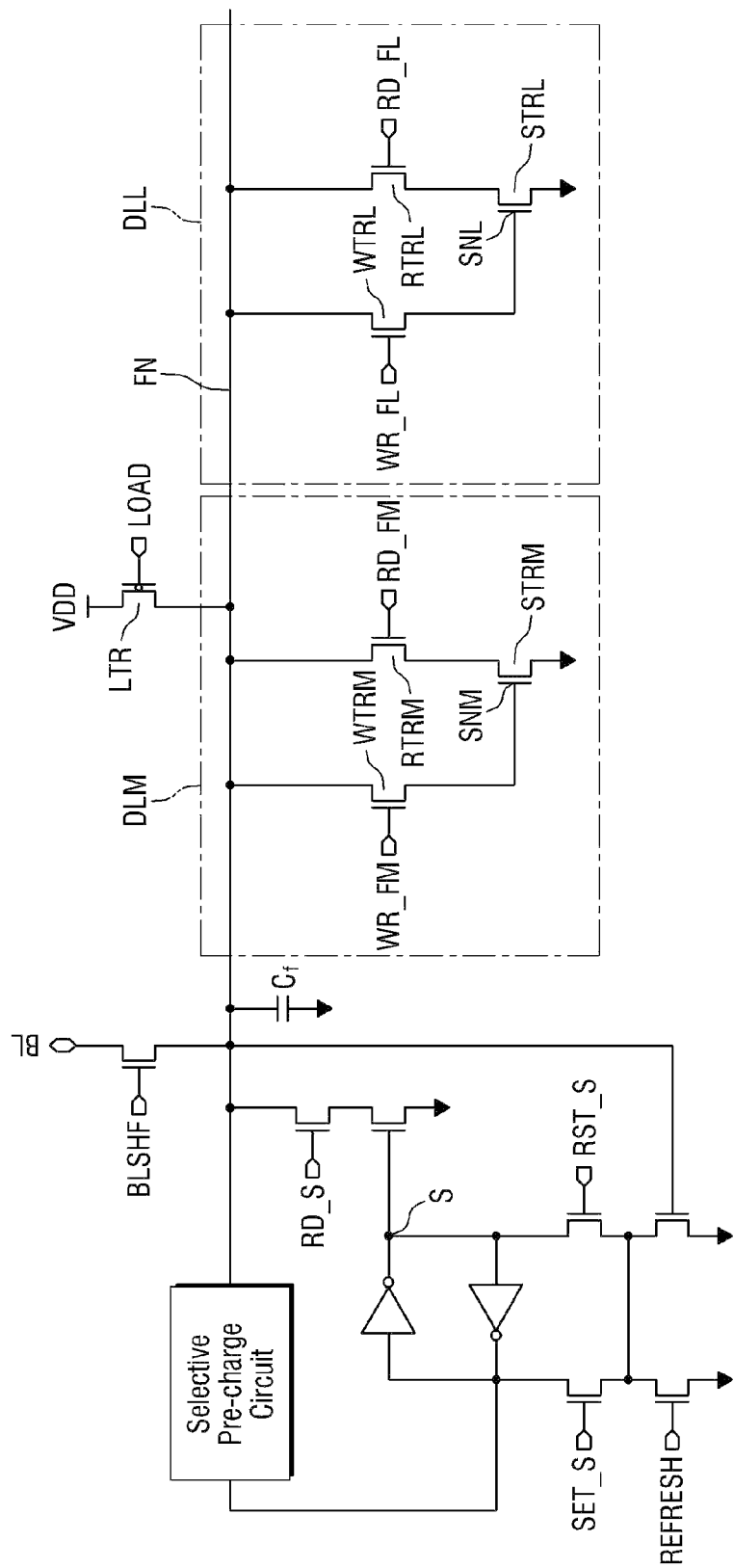
FIG. 10 is a circuit diagram of a page buffer according to still another embodiment of the inventive concept.

FIG. 10 is a circuit diagram of a page buffer according to still another embodiment of the inventive concept. This embodiment has certain features in common with other embodiments, and a repeated description of those features may be omitted in order to avoid redundancy.

Referring to FIG. 10, the page buffer comprises a static latch S, a first dynamic latch DLM, and a second dynamic latch DLL. The page buffer is connected to memory cell array 110 comprising a multi-level memory cell storing data of a first bit (e.g., MSB) and data of a second bit (e.g., LSB).

Static latch S receives the data of the first and second bits MSB and LSB and stores the same therein. First dynamic latch DLM receives the data of first bit MSB stored in static latch S through a floating node FN, and second dynamic latch DLL receives the data of second bit LSB stored in static latch S through floating node FN.

Detailed configurations of the first and second dynamic latches DLM and DLL are substantially the same as those of other embodiments described above, and repeated descriptions thereof will not be given. Although, FIG. 10 illustrates the page buffer comprises first dynamic latch DLM that receives the first bit (MSB) data, second dynamic latch DLL that receives the second bit (LSB) data, the number of dynamic latches DLM and DLL may be increased in other embodiments. For example, the page buffer could be modified to include a first dynamic latch DLM that receives first bit (MSB) data, a second dynamic latch DLL that receives second bit (CSB) data, and a third dynamic latch DLL that receives third bit (LSB) data.

Figure 11:
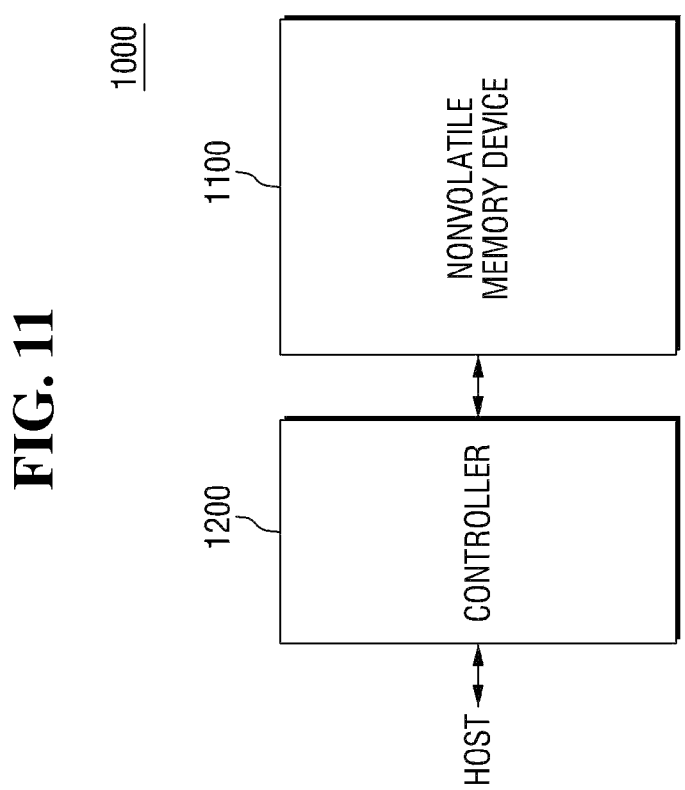
FIG. 11 is a block diagram illustrating a memory system according to an embodiment of the inventive concept.
Figure 12:
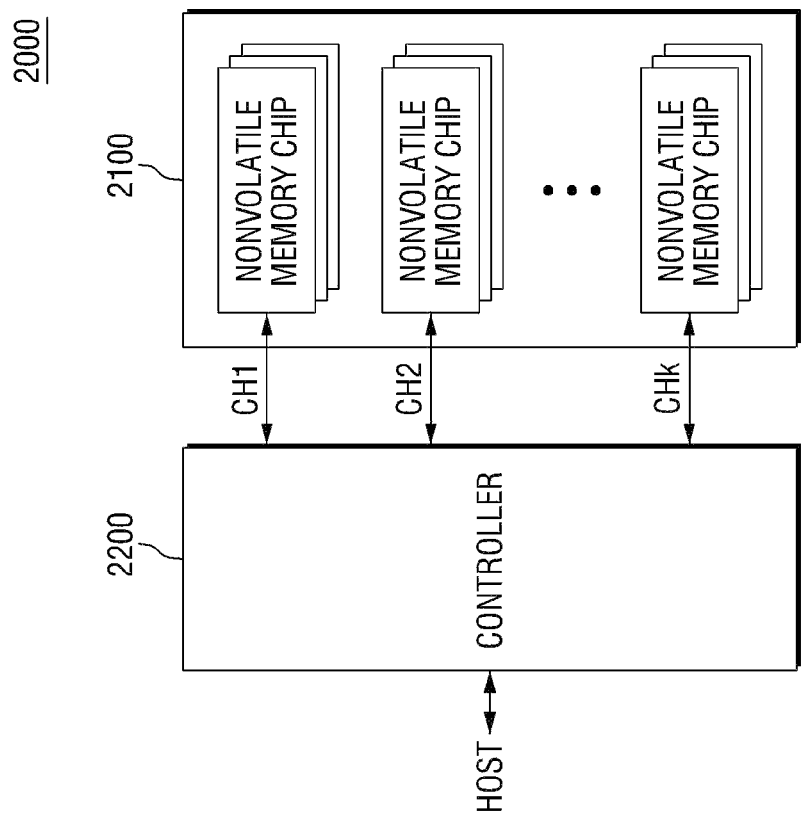
FIG. 12 is a block diagram illustrating a variation of the memory system of FIG. 11.
Figure 13:
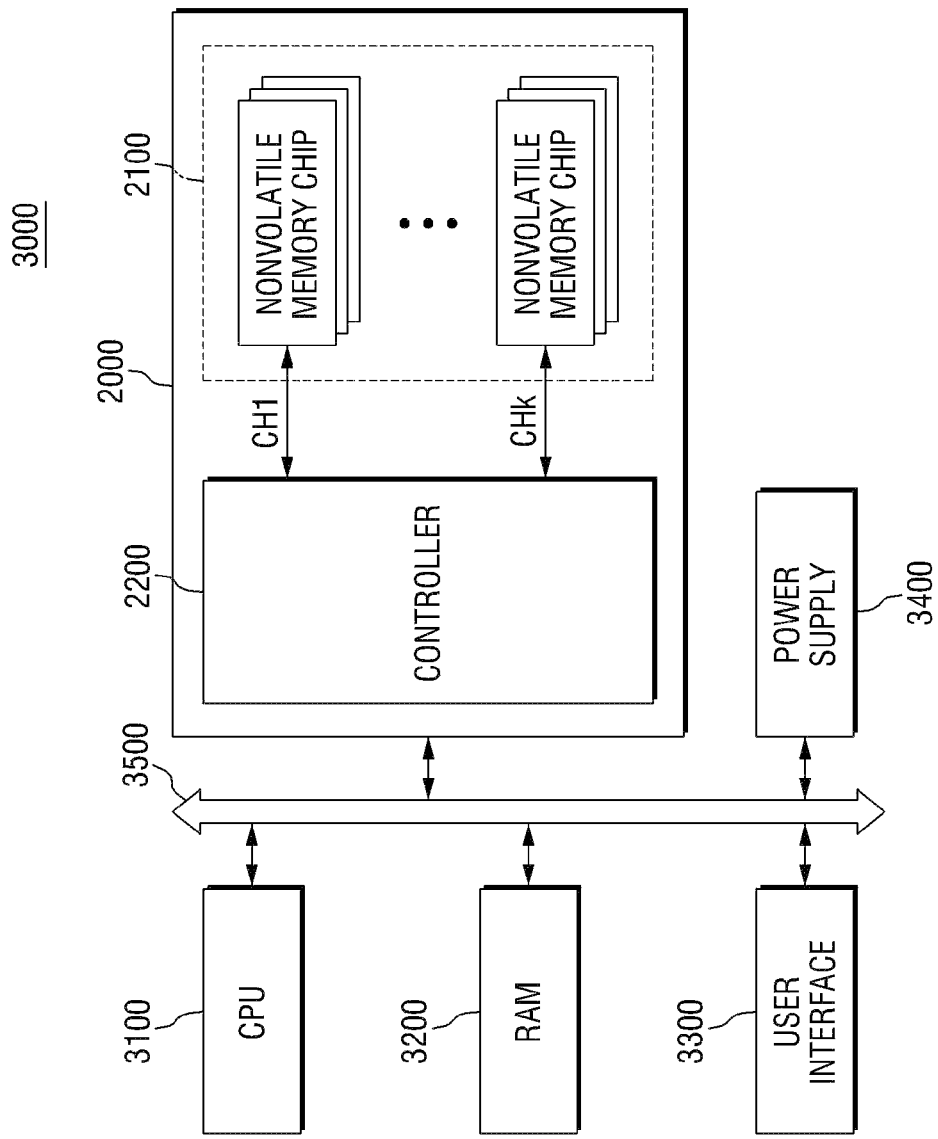
FIG. 13 is a block diagram illustrating a computing system incorporating the memory system of FIG. 12.

FIG. 11 is a block diagram of a memory system according to an embodiment of the inventive concept, FIG. 12 is a block diagram illustrating a variation of the memory system of FIG. 11, and FIG. 13 is a block diagram illustrating a computing system comprising the memory system shown in FIG. 12.

Referring to FIG. 11, memory system 1000 comprises a nonvolatile memory device 1100 and a controller 1200. Nonvolatile memory device 1100 typically comprises memory device 100 of FIG. 1. Controller 1200 is connected to a host and a nonvolatile memory device 1100. In response to a request from the host, controller 1200 accesses nonvolatile memory device 1100. For example, controller 1200 may be configured to control read, write, erase and background operations of nonvolatile memory device 1100. Controller 1200 also provides an interface between nonvolatile memory device 1100 and the host. Controller 1200 is configured to drive firmware for controlling nonvolatile memory device 1100.

Controller 1200 may comprise additional features such as a random access memory (RAM), a processing unit, a host interface, and a memory interface. The RAM can be used as at least one of an operation memory of the processing unit, a cache memory between nonvolatile memory device 1100 and the host, and a buffer memory between nonvolatile memory device 1100 and the host. The processing unit is configured to control the overall operation of controller 1200.

The host interface implements a protocol for performing the exchange of data between a host and controller 1200. For example, in some embodiments, controller 1200 may be configured to communicate with an external host using one or more standard data protocols such as USB, MMC, PCI-E, advanced technology attachment (ATA), Serial-ATA, Parallel-ATA, SCSI, ESDI, and integrated drive electronics (IDE). Moreover, the memory interface may comprise a NAND interface or a NOR interface.

Memory system 1000 typically provides an interface between nonvolatile memory device 1100 and external data sources and destinations. Controller 1200 may, in certain embodiments, include an error correction code (ECC) block. The ECC block detects and/or corrects one or more data errors in read data retrieved from nonvolatile memory device 1100.

Controller 1200 and nonvolatile memory device 1100 can be commonly integrated within a single integrated circuit device. For example, controller 1200 and nonvolatile memory device 1100 can be integrated within a memory card, a PC card (PCMCIA), a compact flash card (CF), a smart media card (SM/SMC), a memory stick, a multimedia card (MMC, RS-MMC, MMCmicro), an SD card (SD, miniSD, microSD), or a universal flash memory device (UFS).

In some embodiments, controller 1200 and nonvolatile memory device 1100 are integrated to form a solid-state disk/drive (SSD). Where memory system 1000 is a SSD, the operating speed of a host connected to memory system 1000 may be dramatically improved.

In some embodiments, memory system 1000 may be integrated with a computer, a portable computer, a UMPC, a workstation, a net-book, a PDA, a wet tablet, a wireless phone, a mobile phone, a smart phone, a digital camera, a digital audio recorder/player, a digital picture/video recorder/player, an apparatus for transmitting and receiving information under the wireless environment, one of various electronic devices constituting a home network, one of various electronic devices constituting a computer network, one of various electronic devices constituting a telematics network or one of various electronic devices, such as a solid-state disk/drive (SSD) or a memory card, constituting a computing system.

Nonvolatile memory device 1100 or memory system 1000 may be mounted in various types of packages or package configurations, such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

Referring to FIG. 12, memory system 2000 comprises a nonvolatile memory device 2100 and a controller 2200. Nonvolatile memory device 2100 comprises a plurality of nonvolatile memory chips divided into a plurality of groups. The respective groups of nonvolatile memory chips are configured to communicate with controller 2200 through a common channel. For example, in the illustrated embodiment, the nonvolatile memory chips are configured to communicate with controller 2200 through first to kth channels CH1 to CHk.

Although FIG. 12 illustrates that a plurality of nonvolatile memory chips are connected to one channel, memory system 2000 may be modified such that one nonvolatile memory chip is connected to one channel.

Referring to FIG. 13, computing system 3000 comprises a central processing unit (CPU) 3100, a random access memory (RAM) 3200, a user interface 3300, a power supply 3400, and memory system 2000. Memory system 2000 is electrically connected to CPU 3100, RAM 3200, user interface 3300, and power supply 3400 through a system bus 3500. Data provided through user interface 3300 or processed by CPU 3100 is stored in memory system 2000.

Although FIG. 13 illustrates that nonvolatile memory device 2100 is connected to system bus 3500 through controller 2200, nonvolatile memory device 2100 may also be configured to be directly connected to system bus 3500. Moreover, although FIG. 13 shows computing system 3000 with memory system 2000, memory system 2000 could be replaced with memory system 1000 of FIG. 11, or computing system 3000 could be modified to include both of memory systems 1000 and 2000.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A page buffer, comprising:
 a static latch configured to store data received from an external device; and
 a dynamic latch configured to receive the data stored in the static latch through a floating node, the dynamic latch comprising a storage capacitor, a write transistor configured to write the data of the floating node to the storage capacitor, and a read transistor configured to read the data of the storage capacitor, and the write transistor and the read transistor sharing the floating node.

2. The page buffer of claim 1, further comprising a storage transistor comprising the storage capacitor, wherein the write transistor is connected to a gate electrode of the storage transistor, and the read transistor is connected to a drain electrode of the storage transistor.

3. The page buffer of claim 2, wherein the storage transistor further comprises a negative metal oxide semiconductor (NMOS) transistor, and a source electrode of the storage transistor is connected to a ground terminal.

4. The page buffer of claim 2, wherein a channel section area of the storage transistor is greater than a channel section area of the write transistor or the read transistor.

5. The page buffer of claim 1, wherein the floating node remains in a floating state while the data of the floating node is written to the storage capacitor or the data of the storage capacitor is read.

6. The page buffer of claim 1, wherein a channel length of the write transistor is greater than a channel length of the read transistor.

7. The page buffer of claim 6, wherein a channel width of the write transistor is smaller than a channel width of the read transistor.

8. The page buffer of claim 1, wherein the write transistor comprises two or more write transistors.

9. The page buffer of claim 8, wherein the two or more write transistors are serially connected to the floating node.

10. A method of operating a memory device, comprising:
storing data from a memory cell to a static latch, and
storing data from the static latch to a storage capacitor of a dynamic latch through a floating node, wherein the data from the static latch is stored in the storage capacitor by charge sharing based on a ratio of capacitance of the floating node to capacitance of the storage capacitor.

11. The method of claim 10, wherein a capacitance of the floating node is greater than a capacitance of the storage capacitor.

12. The method of claim 10, wherein a level of the data stored in the static latch is changed to then be stored in the storage capacitor.

13. The method of claim 12, wherein the data stored in the static latch is changed in its data level to then be stored in the floating node, and the data stored in the floating node is not changed in its data level to then be stored in the storage capacitor.

14. The method of claim 10, further comprising:
storing external data in a storage capacitor of the dynamic latch;
storing the data from the storage capacitor to the static latch through the floating node; and
storing the data from the static latch to the memory cell,
wherein the data from the storage capacitor is not changed in its data level to then be stored in the static latch.

15. The method of claim 14, wherein the data from in the storage capacitor is changed in its data level to then be stored in the floating node, and the data stored in the floating node is changed in its data level to then be stored in the static latch.

16. A memory device, comprising:
a memory cell array comprising a plurality of memory cells;
a page buffer configured to store data to be written in a selected memory cell among the plurality of memory cells and to read the stored data from the selected memory cell,
wherein the page buffer comprises a static latch configured to store data received from an external device, and a dynamic latch configured to receive the data stored in the static latch through a floating node, the dynamic latch comprising a storage capacitor, a write transistor configured to write the data of the floating node to the storage capacitor, and a read transistor configured to read the data of the storage capacitor, and the write transistor and the read transistor sharing the floating node.

17. The memory device of claim 16, wherein the page buffer further comprises a storage transistor comprising the storage capacitor, wherein the write transistor is connected to a gate electrode of the storage transistor, and the read transistor is connected to a drain electrode of the storage transistor.

18. The memory device of claim 17, wherein a channel section area of the storage transistor is greater than a channel section area of the write transistor or the read transistor.

19. The memory device of claim 16, wherein the floating node remains in a floating state while the data of the floating node is written to the storage capacitor or the data of the storage capacitor is read.

20. The memory device of claim 16, wherein the memory cell array is a multi-level cell flash memory cell array.

* * * * *